(12) United States Patent
Seever

(10) Patent No.: US 8,179,168 B2
(45) Date of Patent: May 15, 2012

(54) THREE-PHASE GENERATOR FOR MOTOR CONTROL

(76) Inventor: Larry G. Seever, Sarona, WI (US)

( * ) Notice: Subject to any disclaimer, the term of this patent is extended or adjusted under 35 U.S.C. 154(b) by 174 days.

(21) Appl. No.: 12/732,355

(22) Filed: Mar. 26, 2010

(65) Prior Publication Data

US 2011/0234286 A1 Sep. 29, 2011

(51) Int. Cl.
*H03K 3/00* (2006.01)
(52) U.S. Cl. ........................................ 327/108
(58) Field of Classification Search .................. None
See application file for complete search history.

(56) References Cited

U.S. PATENT DOCUMENTS 5,734,250 A * 3/1998 Lindmark ................... 318/801
6,320,731 B1 11/2001 Eaves et al.
6,999,347 B2 * 2/2006 Mitani ..................... 365/185.22

* cited by examiner

*Primary Examiner* — Lincoln Donovan
*Assistant Examiner* — Sibin Chen
(74) *Attorney, Agent, or Firm* — Clifford Kraft

(57) ABSTRACT

A pulse generator that can generate pulses separated by 120 degrees phase on each of three separate phase output leads for use with a 3-phase motor power driver. These output pulses can be of any desired frequency and voltage. In a particular embodiment of the invention, the phase output pulses take a logic level of 0-12 volts (12 volts peak) with an adjustable frequency of around 250 Hz and a duty cycle of around 50%. This combination of parameters is ideal for driving a 3-phase motor in a vehicle application. Any combination of pulse width or duty cycle, output level and frequency is within the scope of the present invention.

19 Claims, 3 Drawing Sheets

THREE-PHASE GENERATOR FOR MOTOR CONTROL

BACKGROUND

1. Field of the Invention

The present invention relates generally to the field of 3-phase motor controllers and more particularly to a pulse generator that can generate three phase signals suitable to control a 3-phase motor.

2. Description of the Prior Art 3-phase motors have been used in numerous industrial applications for decades. These motors, while having three separate windings normally have the windings connected in standard delta or wye configurations. It is known in the art, but not common, to control each motor phase separately with power sinusoidal signal applied to each winding. For example, Eaves in U.S. Pat. No. 6,320,731 teaches a 3-phase motor system with separate windings driven by separate sinusoidal power supplies. In motor-vehicle applications, where a 3-phase electric motor is used in a vehicle to replace a gasoline or diesel engine, it is very desirable to drive and control each phase separately.

It would be advantageous to have a 3-phase generator that could generate pulses on three phase leads that are separated by 120 degrees of phase. This pulse generator could then drive a voltage converter to supply high voltage pulses to each phase winding of the motor and to a capacitor that is coupled across the phase winding.

SUMMARY OF THE INVENTION

The present invention relates to a pulse generator that can generate pulses separated by 120 degrees phase on each of three separate phase output leads. These output pulses can be of any desired frequency and voltage. In a particular embodiment of the invention, the phase output pulses take a logic level of 0-12 volts (12 volts peak) with an adjustable frequency of around 250 Hz and a duty cycle of around 50%. This combination of parameters is ideal for driving a 3-phase motor in a vehicle. Any combination of pulse width or duty cycle, output level and frequency is within the scope of the present invention.

The 3-phase pulse generator of the present invention is normally free-running, economical to manufacture, rugged, and applicable to a wide range of 3-phase motor applications. The generator can run at a fixed frequency (repetition rate), or it can be continuously adjustable over a wide frequency range.

DESCRIPTION OF THE FIGURES

Attention is now directed to several illustrations that describe features of the present invention.

Several illustrations and drawings have been presented to aid in understanding the present invention. The scope of the present invention is not limited to what is shown in the figures.

DESCRIPTION OF THE INVENTION

The present invention relates to a pulse generator that can produce logic pulses on three outputs that are separated by 120 degrees in phase suitable to drive a power controller for a 3-phase motor. The frequency or repetition rate is selectable and optionally adjustable with a preferred rate around 250 Hz. The output logic level can be controlled by choosing different voltages to power the output driver transistors. Pulse width could be optionally altered by placing devices like one-shots before the drivers.

Figure 1:
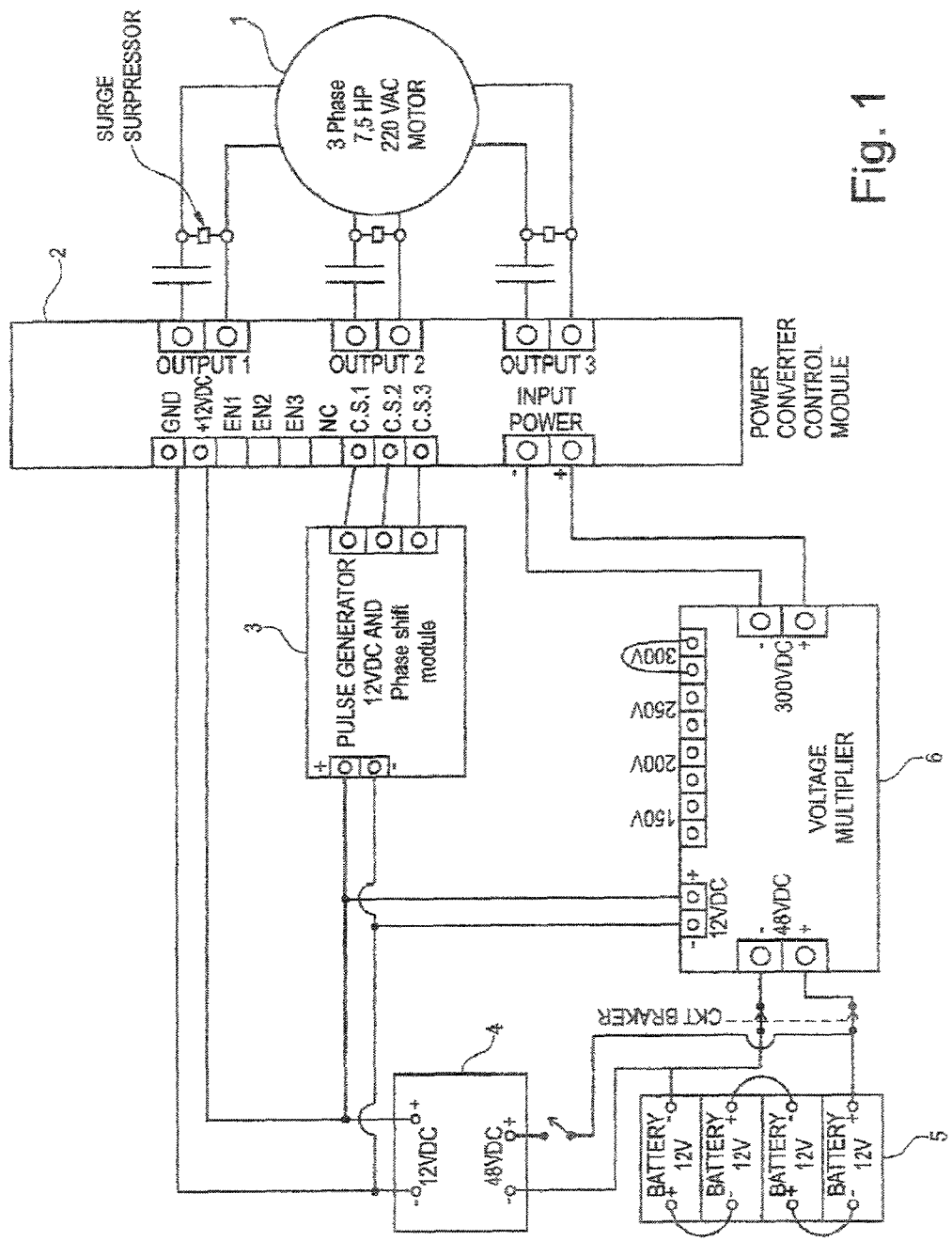
FIG. 1 is a block diagram of a vehicle 3-phase motor application containing the generator of the present invention.

Turning to FIG. 1, a block diagram of a vehicle 3-phase motor application can be seen. A voltage multiplier 6 converts 48 VDC to around 300 VDC which is applied to a power converter control module 2. This power control module is connected to each of the three phases of the motor 1 with a capacitor in series with the motor winding and an optional surge suppressor across the winding. The 48 volt battery voltage can also be down-converted 4 to 12 VDC to control logic or 12 VDC can be taken from one of the four battery parts. The pulse generator 3 of the present invention takes 12 VDC in and produces three phase control pulse signals out that drive the C.S windings of the power converter control module.

Figure 2:
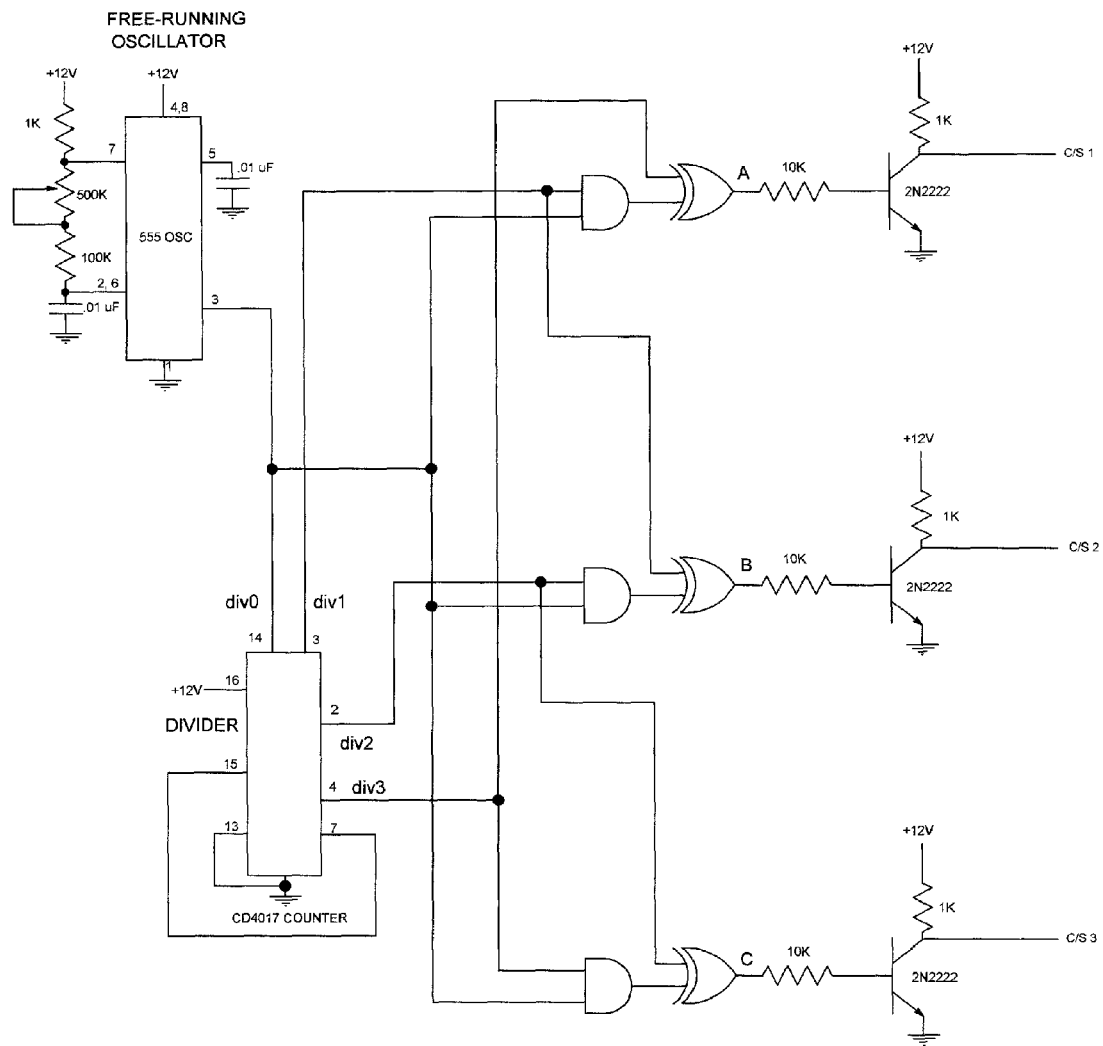
FIG. 2 is an embodiment of a 3-phase pulse generator.

FIG. 2 shows an embodiment of a pulse generator of the present invention. A 555 oscillator chip is connected to free-run and produce an adjustable square-wave of around 250 Hz. This chip, and all of the other logic in this embodiment is run at 12 VDC. The 555 chip and the other CMOS logic of this embodiment will operate over a range of voltages from around 5 VDC up to around 15 VDC.

Figure 3:
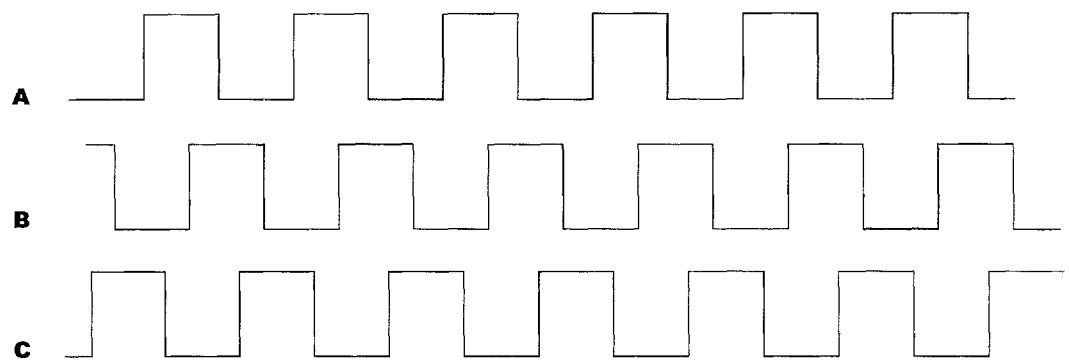
FIG. 3 shows sample waveforms generated by the embodiment of FIG. 2.

The square-wave from the 555 oscillator runs a CMOS CD4017 counter that acts as a simple divider. If the input on pin 14 is a square-wave of 250 Hz, the output on pin 3 is 125 Hz, on pin 2 is 62.5 Hz and on pin 4 is 31.25 Hz. These frequencies will be henceforth referred to as fundamental, 1st divide, 2nd divide and 3rd divide. The combination of the three divided frequencies is compared against the fundamental undivided frequency by three AND gates. These AND gates can be standard CMOS parts such as the CD4081. The output of the AND gates are each connected to the one input of three EXCLUSIVE OR gates (EOR). These EOR gates can be standard CMOS parts such as the CD4030. These AND/EOR pairs will be referred to phase logic (PH1, PH2 and PH3 logic). The other input of the EOR gates in each phase logic is connected to one of the divided frequencies. In the case of PH1, the AND ties to the 1st divide, and the EOR ties to the 3rd divide. For PH2, the AND ties to the 2nd divide, and the EOR ties to the 1st divide. For PH3, the AND ties to the 3rd divide, and the EOR ties to the 2nd divide. This unique combination of logic produces the pulse waveforms shown in FIG. 3, namely (at a fundamental of 250 Hz), with a cycle time of 4 mS with 1.33 mS offset between phases.

If the undivided square-wave signal is labeled (div0), the divided by 2 signal (div1), the divided by 4 signal (div2), and the divided by 8 signal (div3), the outputs A, B, and C of the three EOR gates obey the following equations: A=(div3) EOR (div1 AND div0), a second output B=(div1) EOR (div2 AND div0), and a third output C=(div2) EOR (div3 AND div0).

Each phase logic group's output is connected to a 2N2222 NPN transistor driver running +12 VDC or equivalent driver. This produces a pulse height of slightly less than 12 volts suitable to drive a power controller. An embodiment of this driver circuit is shown in FIG. 2. Any driver is within the scope of the present invention including no driver at all.

Several descriptions and illustrations have been presented to aid in understanding the present invention. One skilled in the art will realize that numerous changes and variations can be made without departing from the spirit of the invention. Each of these changes and variations is within the scope of the present invention.

I claim:

1. A free-running 3-phase pulse driver comprising:
   a free-running oscillator;
   3-phase generating logic circuit having an input and three outputs, said input electrically coupled to said free-running oscillator, wherein said 3-phase generating logic circuit generates electrical signals on each of said outputs, said electrical signals separated from one another by 120 degrees of phase;
   at least three separate phase drivers, each of said phase drivers electrically attached to an output of said 3-phase generating logic;
   a divider taking an undivided signal (div0) from said free-running oscillator and dividing it by 2 to produce a first divided signal (div1), and dividing it by 4 to produce a second divided signal (div2), and dividing it by 8 to produce a third divided signal (div3);
   a logic circuit electrically coupled to said divider and said free-running oscillator producing a first output A=(div3) EOR (div1 AND div0), a second output B=(div1) EOR (div2 AND div0), and a third output C=(div2) EOR (div3 AND div0).

2. The free-running 3-phase pulse driver of claim 1 wherein said free-running oscillator is a square-wave oscillator.

3. The free-running 3-phase pulse driver of claim 1 wherein said 3-phase generating logic further comprises AND gates and EXCLUSIVE OR gates and at least one divider.

4. The free-running 3-phase pulse driver of claim 1 wherein said 3-phase generating logic further comprises three AND gates and three EXCLUSIVE OR gates and one four-bit divider.

5. The free-running 3-phase pulse driver of claim 1 wherein said phase drivers have a pulse output of between 0 and 12 volts.

6. The free-running 3-phase pulse driver of claim 1 wherein said free-running oscillator runs at around 250 Hz.

7. The free-running 3-phase pulse driver of claim 1 wherein said free-running oscillator is frequency adjustable.

8. A 3-phase pulse producing circuit producing pulses delayed by around 120 electrical degrees on each of three outputs, said circuit comprising:
   a free-running square wave oscillator producing a square-wave (div0);
   a divider electrically coupled to said free-running square wave oscillator producing a first divided signal (div1), a second divided signal (div2), a third divided signal (div3);
   a logic circuit coupled to said free-running oscillator and said divider producing three outputs A, B and C obeying the equations: A=(div3) EOR (div1 AND div0), a second output B=(div1) EOR (div2 AND div0), and a third output C=(div2) EOR (div3 AND div0).

9. The 3-phase pulse producing circuit of claim 8 wherein said free-running square-wave oscillator runs at a frequency of around 250 Hz.

10. The 3-phase pulse producing circuit of claim 8 wherein said free-running oscillator is frequency adjustable.

11. The 3-phase pulse producing circuit of claim 8 further comprising power drivers electrically coupled to said three outputs A, B and C.

12. The 3-phase pulse producing circuit of claim 8 wherein said equations are realized by three AND gates and three EOR gates.

13. The 3-phase pulse producing circuit of claim 11 wherein said power drivers are bipolar transistors.

14. A 3-phase pulse producing logic circuit having four inputs (div0), (div1), (div2) and (div3) and three outputs A, B and C wherein (div0) is a square-wave of a particular frequency, (div1) is a square-wave of half frequency of (div0), (div2) is a square-wave of half frequency of (div1), and (div3) is a square-wave of half frequency of (div2) comprising:
   a plurality of logic gates producing said outputs A, B and C according to: A=(div3) EOR (div1 AND div0), B=(div1) EOR (div2 AND div0), C=(div2) EOR (div3 AND div0).

15. The 3-phase pulse producing logic circuit of claim 14 further comprising a free-running oscillator producing said input (div0).

16. The 3-phase pulse producing logic circuit of claim 14 further comprising a free-running oscillator producing said input (div0) and a divider producing said inputs (div1), (div2) and (div3) by successive division.

17. The 3-phase pulse producing logic circuit of claim 14 further comprising power drivers electrically coupled to said outputs A, B and C.

18. The 3-phase pulse producing logic circuit of claim 17 wherein said power drivers are bipolar transistors.

19. The 3-phase pulse producing logic circuit of claim 18 wherein said bipolar transistors operate between 0 and 12 volts.

* * * * *